United States Patent
Cannon et al.

(10) Patent No.: US 9,223,037 B2
(45) Date of Patent: Dec. 29, 2015

(54) STRUCTURE AND METHOD TO ENSURE CORRECT OPERATION OF AN INTEGRATED CIRCUIT IN THE PRESENCE OF IONIZING RADIATION

(75) Inventors: Ethan H. Cannon, Sammamish, WA (US); Michael J. Hauser, Bolton, VT (US); Timothy D. Sullivan, Underhill, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 849 days.

(21) Appl. No.: 13/442,062

(22) Filed: Apr. 9, 2012

(65) Prior Publication Data

US 2014/0032135 A1 Jan. 30, 2014

(51) Int. Cl.
G01B 5/28 (2006.01)
G01T 5/02 (2006.01)
H01L 23/556 (2006.01)
H01L 27/146 (2006.01)
H01L 23/00 (2006.01)

(52) U.S. Cl.
CPC ............... G01T 5/02 (2013.01); H01L 23/556 (2013.01); H01L 27/14618 (2013.01); H01L 27/14636 (2013.01); H01L 24/16 (2013.01); H01L 2224/16225 (2013.01); H01L 2924/12032 (2013.01); H01L 2924/157 (2013.01); H01L 2924/15331 (2013.01)

(58) Field of Classification Search
None
See application file for complete search history.

(56) References Cited

U.S. PATENT DOCUMENTS

| | | | |
|---|---|---|---|
| 4,800,299 A | 1/1989 | Hayward | |
| 5,736,930 A * | 4/1998 | Cappels | 340/642 |
| 6,037,595 A | 3/2000 | Lingren | |
| 6,649,913 B1 | 11/2003 | Kennedy et al. | |
| 6,909,159 B2 | 6/2005 | Friend et al. | |
| 7,491,948 B2 | 2/2009 | Gordon et al. | |
| 7,498,644 B2 | 3/2009 | Shapiro et al. | |
| 7,550,730 B1 | 6/2009 | Cannon et al. | |
| 7,579,666 B2 | 8/2009 | Bui et al. | |
| 7,675,789 B2 | 3/2010 | Chen et al. | |
| 7,875,854 B2 | 1/2011 | Cannon et al. | |
| 7,880,340 B2 * | 2/2011 | Miller | 307/130 |

\* cited by examiner

*Primary Examiner* — Aditya Bhat
(74) *Attorney, Agent, or Firm* — Gibb & Riley, LLC; David A. Cain, Esq.

(57) ABSTRACT

Systems and methods to ensure correct operation of a semiconductor chip in the presence of ionizing radiation is disclosed. The system includes a semiconductor chip, a first radiation detection array incorporated in the semiconductor chip, and at least one additional radiation detection array incorporated in the semiconductor chip. a processor determines a region of the semiconductor chip affected by an incident radiation particle by analyzing a trajectory of the radiation particle determined from locations of sensors hit by the radiation particle in the first radiation detection array and the at least one additional radiation detection array. The processor determines whether corrective action is needed based on the region of the semiconductor chip affected by the incident radiation particle.

20 Claims, 13 Drawing Sheets

STRUCTURE AND METHOD TO ENSURE CORRECT OPERATION OF AN INTEGRATED CIRCUIT IN THE PRESENCE OF IONIZING RADIATION

BACKGROUND

The present disclosure relates to integrated circuit chips, and more specifically, to method and system to protect an integrated circuit in the presence of radiation particle events.

Ionizing radiation can cause single event upsets (SEUs) in microprocessors. High-energy radiation particles that impact atoms in an active area of an integrated circuit chip can destroy information or lead to incorrect operation. Ionizing radiation can directly upset storage circuits, such as SRAMs, register files, and latches. Moreover, radiation events in combinational logic create voltage glitches that can be latched. SEUs may cause the processor to perform incorrect or illegal operations. Methods to protect against SEUs include adding spatial and/or temporal redundancy, so that a single radiation event cannot cause an SEU. Redundancy solutions incur area, power, and performance penalties.

SUMMARY

An integrated circuit is protected against SEU by integrating on-chip arrays of radiation sensors. The radiation sensor arrays measure the position of an ionizing radiation particle as it passes through the chip. The integrated circuit calculates the trajectory of the radiation particle, and the location of the radiation event in the chip's sensitive volume. The chip determines whether corrective action, such as rollback to a checkpoint or command reissue, is necessary based on the location of the radiation event and the previous workload. For example, radiation events in memory arrays may be protected by error detection and correction (EDAC), while radiation events in a functional unit performing a calculation require corrective action.

This disclosure provides a mechanism whereby the location of an SEU can be determined. Current implementation of radiation-hardened circuitry may employ circuit redundancy that reduces performance, leads to increased fabrication cost and higher power consumption. By having an SEU locator, it becomes possible to flag a specific circuit operation for error checking to correct any loss of information that might have occurred due to the SEU.

According to one embodiment herein, a system to ensure correct operation of a semiconductor chip in the presence of ionizing radiation is disclosed. The system includes a semiconductor chip, a first radiation detection array incorporated in the semiconductor chip, and at least one additional radiation detection array incorporated in the semiconductor chip. A processor determines a region of the semiconductor chip affected by an incident radiation particle by analyzing the trajectory of the radiation particle determined from locations of sensors hit by the radiation particle in the first radiation detection array and the at least one additional radiation detection array. The processor determines whether corrective action is needed based on the region of the semiconductor chip affected by the incident radiation particle.

According to another embodiment herein, a computer-implemented method of ensuring correct operation of a semiconductor chip in the presence of ionizing radiation is disclosed. Interaction of a radiation particle with a first radiation detection array incorporated in a semiconductor chip is detected. The first radiation detection array provides a location of the sensors hit by the radiation particle to a computing device. Interaction of the radiation particle with at least one additional radiation detection array incorporated in the semiconductor chip is detected. The at least one additional radiation detection array provides a location of the sensors hit by the radiation particle to the computing device. The computing device calculates a trajectory of the radiation particle and determines a region of the semiconductor chip affected by the radiation particle. The computing device analyzes operation of the affected region of the semiconductor chip. The computing device determines whether corrective action is needed based on the region of the semiconductor chip affected by the radiation particle.

According to another embodiment herein, a non-transitory computer readable storage medium readable by a computerized device, the non-transitory computer readable storage medium storing instructions executable by the computerized device to perform a method of ensuring correct operation of a semiconductor chip in the presence of ionizing radiation is disclosed. In the method, an interaction of a radiation particle with a first radiation detection array incorporated in a semiconductor chip is detected. The first radiation detection array provides a location of the sensors hit by the radiation particle to the computerized device executing the instructions. An interaction of the radiation particle with at least one additional radiation detection array incorporated in the semiconductor chip is detected. The at least one additional radiation detection array provides a location of the sensors hit by the radiation particle to the computerized device. A trajectory of the radiation particle is calculated. A region of the semiconductor chip affected by the radiation particle is determined. Operation of the affected region of the semiconductor chip is analyzed. Whether corrective action is needed based on the region of the semiconductor chip affected by the radiation particle is determined.

BRIEF DESCRIPTION OF THE DRAWINGS

The embodiments herein will be better understood from the following detailed description with reference to the drawings, which are not necessarily drawing to scale and in which.

DETAILED DESCRIPTION

According to embodiments herein, addressable planar sensor arrays are integrated into packaging, active chip, or added interposer layers in order to detect radiation events. The region on the chip affected by a radiation event is calculated from the trajectory determined from positions of sensors hit in two or more sensor arrays. Rather than taking corrective action each time a radiation event is detected, embodiments herein determine whether corrective action is needed. By taking action only when necessary can improve overall performance by reducing the time required for corrective action. This can reduce the cost of the chip and reduce power consumption.

According to an embodiment herein, radiation detectors that will switch at a predetermined threshold of charge collection due to the penetration of a high-energy particle are disclosed. One implementation of this structure consists of a matrix of image sensors within each sensor plane coupled into two multiplexers to provide sets of coordinates as described below.

Three different types of radiation sensor arrays are described herein. Multiple layers of sensor arrays may be used to track the motion of ionizing radiation particles in a semiconductor chip. Described herein are methods to use the radiation sensor arrays to protect an integrated circuit against single event upset (SEU).

The first radiation sensor array embodiment comprises an array of Schottky diodes in the metallization levels of a semiconductor integrated circuit chip. The Schottky diodes consist of polysilicon with metallic Schottky contacts. Ionizing radiation traversing a Schottky diode generates electron-hole pairs. The Schottky contact collects electrons, leading to a current pulse that indicates an ionizing radiation event. Schottky diodes can be used to detect alpha particles from packaging materials, alpha particles from contamination introduced during wafer processing, and daughter particles of cosmic ray events. Measuring the alpha flux from wafer contamination is especially difficult, since the alpha flux is typically very low, and since the source of contamination may be limited to one or a few tools. However, alpha particles from wafer contamination represent an important SEU concern, because there is less material between the alpha particle source and active circuits to attenuate the alpha particle energy; consequently, alpha particles reach the active circuits at a wider range of energy and angles, and can upset circuits that may be insensitive to alpha particles from packaging materials.

Figure 1:
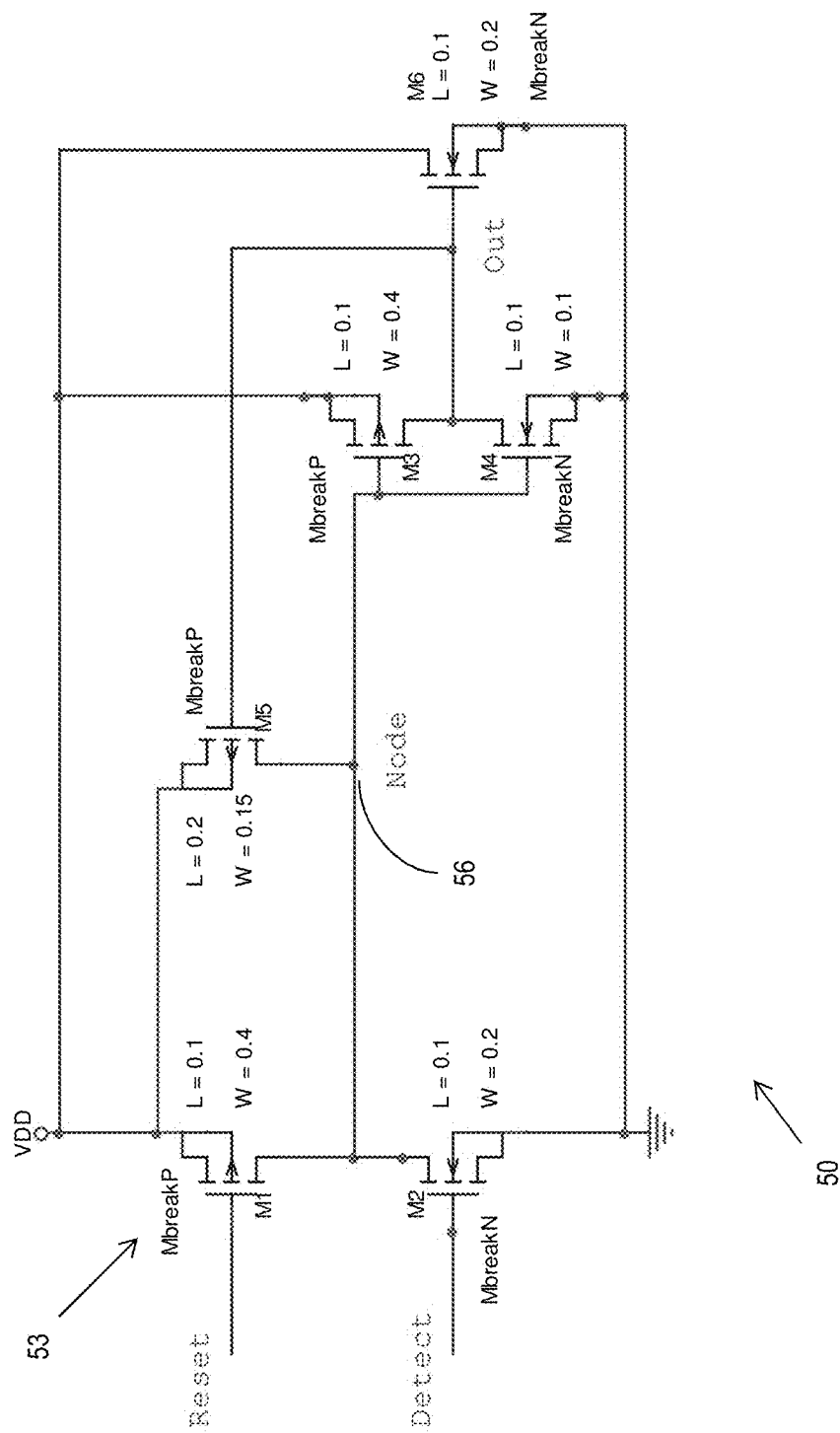
FIG. 1 is a schematic diagram of a radiation sensor illustrating embodiments herein.

Referring to FIG. 1, a Schottky diode 50 generates a current pulse when an alpha particle crosses it. Domino circuits can be used to detect the current pulse. The reset signal 53 sets the domino to detect a current pulse; the Schottky diode connects to Node 56, so that an alpha particle event discharges Node 56, triggering the domino. More than one Schottky diode can be connected to the same domino, and several dominos can be connected in series so that an alpha particle strike in one of many Schottky diodes would trigger the domino chain. The output of the domino chain would normally be low, and a high output would indicate an alpha particle event. Qcrit for a sensitive domino is on the order of 1 fC. Depending on their energy, alpha particles generate 4-13 fC/µm in silicon. The depletion layer width for a Schottky diode is $$W_D = \left[\frac{2\varepsilon(\phi - V)}{qN_d}\right]^{1/2},$$

where $N_d$ is the donor concentration, V is the applied voltage and $\phi$ is the built-in potential. The built-in potential for aluminum, copper, or tungsten with silicon is on the order of a few tenths of eV. With a doping concentration of 1E15 cm$^{-3}$, the depletion layer thickness is a few tenths of microns. Such a Schottky diode would be able to collect more than 1 fC from an alpha-particle event. The capacitance of the Schottky diode is less than 0.1 fF/µm$^2$, so the Schottky diode capacitance would not significantly increase Qcrit for a diode with less than 10 µm$^2$ area.

For example, consider a tungsten Schottky diode with 0.45 eV barrier height; for silicon doped to 1E15 cm$^{-3}$, the depletion width is 0.22 µm and the diode capacitance is 0.04 fF/µm$^2$. For a domino sensitive to a 300 mV voltage swing, a 75 µm$^2$ diode increases Qcrit by 0.9 fC (0.04 fF/µm 2*75 µm$^2$*0.3 V). More than 2 fC would be generated by an alpha particle crossing a 0.5 µm thick silicon layer, enough to flip a domino with Qcrit of 1 fC.

A second radiation sensor array embodiment comprises an array of photodiodes in a silicon carrier. One or more die are mounted on the silicon carrier, which is mounted on a packaging substrate. The silicon carrier includes metal wiring to allow electrical connection from the die to the substrate and, optionally, to each other. The photodiodes consist of N+P diodes. The N+ node is precharged to a voltage Vdd. Ionizing radiation traversing the photodiode generates electron-hole pairs, and electrons are collected at the N+ node, discharging the photodiode and decreasing the node potential. A sense circuit periodically measures the node potential to detect the passage of ionizing radiation.

Figure 2:
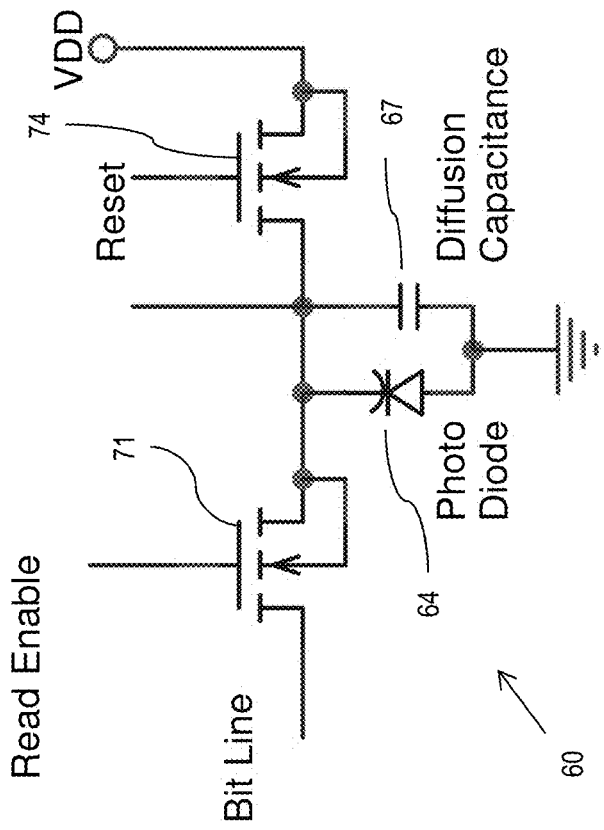
FIG. 2 is a schematic diagram of a radiation sensor illustrating embodiments herein.

Referring to FIG. 2, the sensor cell 60 is comprised of a photodiode 64, an optional capacitor 67, an access device 71, and a reset device 74. The capacitance of the N+P diode may be sufficient so that no external capacitor is required. The N+ node is charged through the reset device 74. The N+ node of the photodiode connects to a bitline through the access device 71, whose gate is controlled by a read enable signal. When the read enable signal is exercised, the photodiode 64 pulls the bitline high in the case of no event, or pulls the bitline low in the case of an event.

Figure 3:
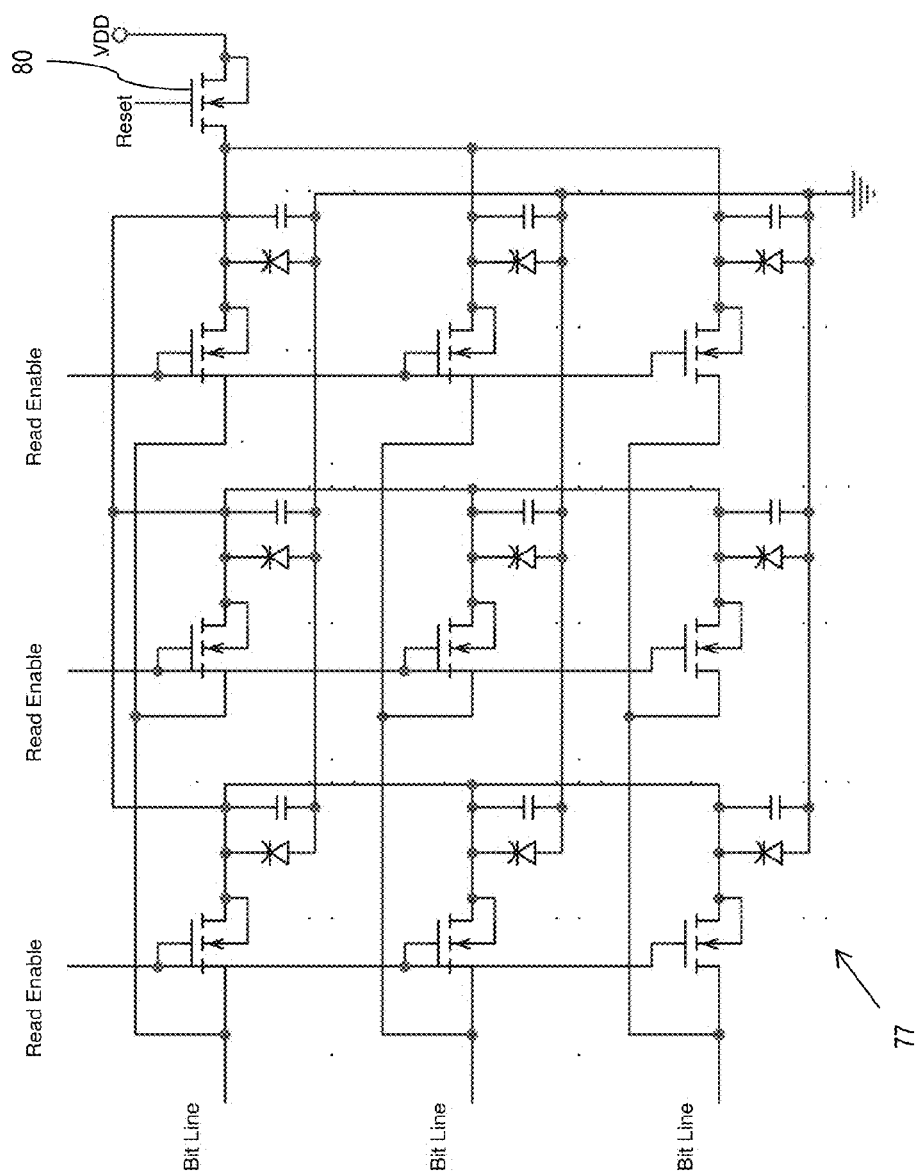
FIG. 3 is a schematic diagram of a radiation sensor array illustrating embodiments herein.

FIG. 3 shows a portion of an array 77 of photodiode-based sensor cells. A single reset device 80 can reset multiple cells; alternatively, each cell may have its own reset device. The Read Enable signal selects a column of the array to read; each cell in the column drives a corresponding Bit Line high (in the case of no event), or low (in the case of an event).

Figure 4:
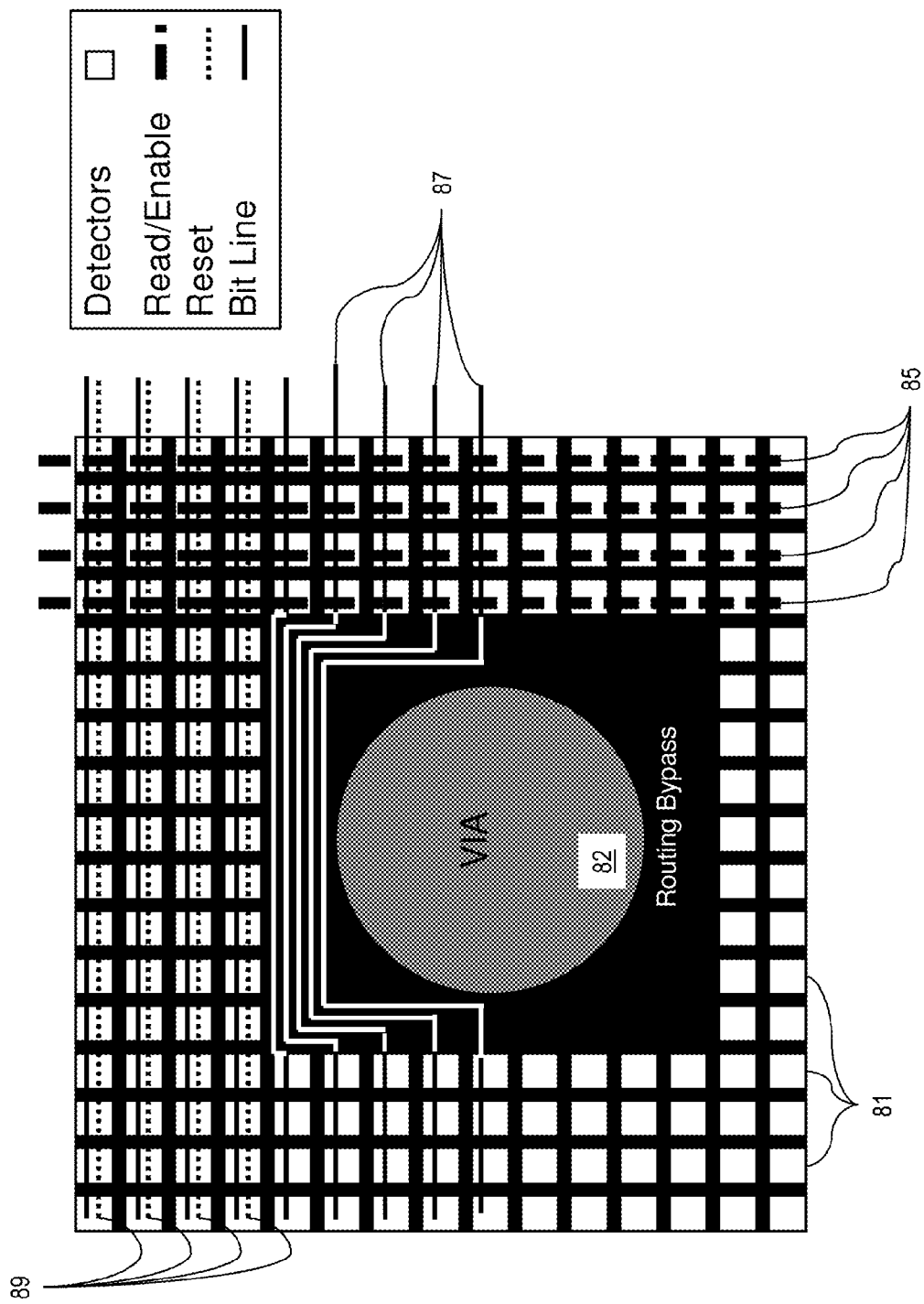
FIG. 4 is a plane view diagram of a radiation sensor illustrating embodiments herein.

The photodiode array 77 must include holes for metal Vias that carry signals across the sensor plane. FIG. 4 shows a top down view of the Silicon Sensor Interposer (plane). Shown are the individual sensor elements 81 (each square represents a sensor element 81) and wire routing to accommodate the through Via structure. The hole must be large enough to allow routing of global signals (Read Enable 85, Bit Line 87, and Reset 89) around the Via 82. The presence of Vias reduces the surface coverage of the sensor array 77, limiting its detection efficiency. Vias 82 would cover about 25% of the surface, so photodiodes 60 could cover about 70% of the surface.

To form the photodiode array 77, deep trenches are etched into a semiconductor wafer and filled with conductive material, such as tungsten, following standard processing for silicon carriers. Standard silicon processing steps are used to form other circuits on the wafer, such as deep trench capacitors, N+P photodiodes, and CMOS circuits. The top of the wafer is attached to a glass handler wafer and the bottom of the wafer is removed, e.g. through backside grind, to reach the deep trenches filled with conductive material. The bottom of the wafer is cleaned and standard silicon processing steps are used to form circuits on the bottom of the wafer, such as a second photodiode array. The glass handler wafer is removed, following standard processing steps for silicon carriers. Using two silicon interposers would provide four layers of sensor cells to improve detection efficiency.

Figure 5:
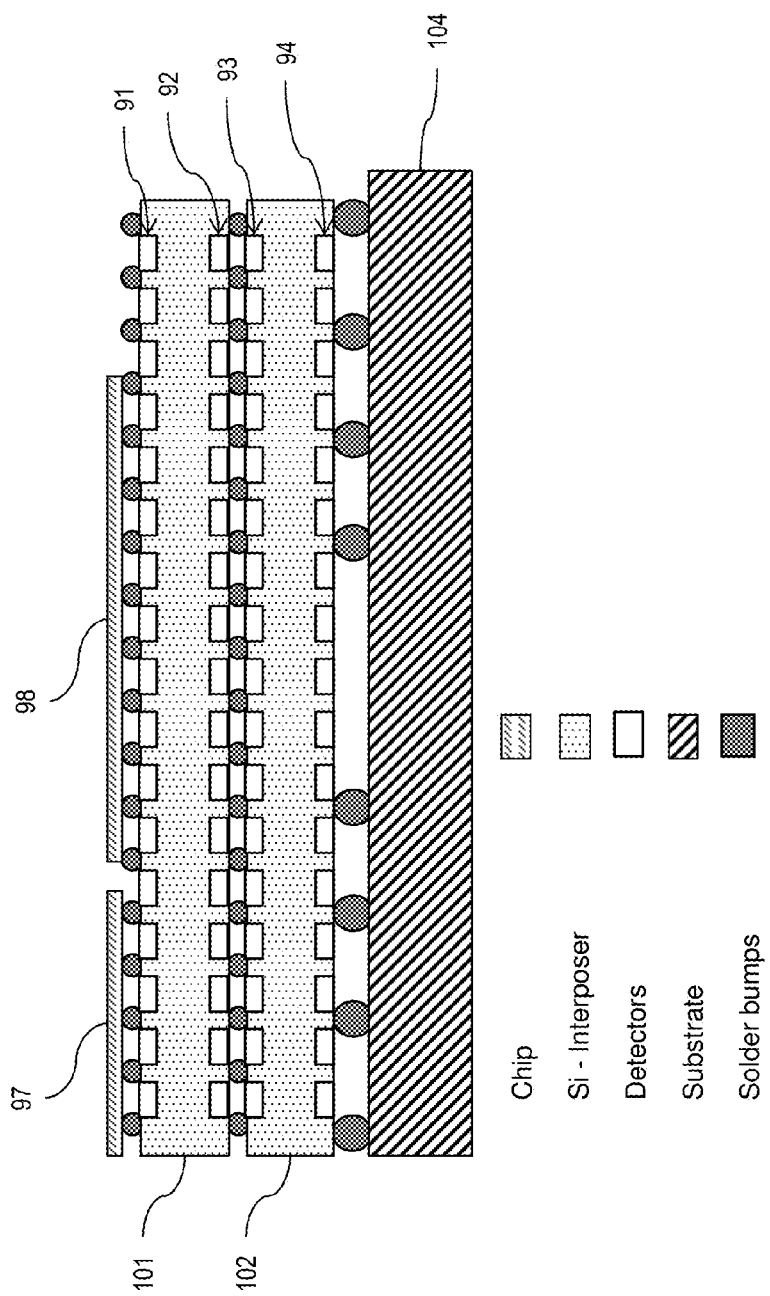
FIG. 5 is a cross section view of a four sensor array illustrating embodiments herein.

FIG. 5 illustrates a cross section view of chips 97, 98 with four sensor arrays 91, 92, 93, 94. The chips 97, 98 are packaged with two silicon interposers 101, 102 on a substrate 104; each silicon interposer has two sensor arrays, one on the top and one on the bottom.

In this embodiment, two parallel arrays of radiation particle sensors are incorporated with the silicon interposer 101, 102. The sensor cell comprises N+–P diode, access device, and a reset device. A radiation particle event leads to charge collection by N+–P diode and discharges the capacitor.

An N+P photodiode efficiently collects charge generated by ionizing radiation. The collection efficiency can be enhanced by tailoring the P-well doping profile; a deep, retrograde well facilitates charge collection from deeper in the substrate. If only course-scale information about the ionizing radiation event location is required, e.g. when the functional unit involved is considered, as discussed below, then individual photodiodes do not need to be isolated. If finer-scale information is required, individual sensor cells may be isolated by incorporating deep trench oxide around the periphery of each cell.

A third radiation sensor array embodiment comprises an array of radiation detectors on a sensor chip that is placed directly over the integrated circuit chip in a 3D packaging (chip stacking) scheme. In IBM's 3D process, a first silicon-on-insulator (SOI) wafer is processed through the metallization with standard silicon processing steps, then the substrate is removed leaving buried oxide (BOX), and the wafer is attached to a glass handler wafer (the handler wafer attaches to the metallization). A second SOI wafer is processed through the metallization with standard silicon processing steps. The first wafer is attached to the second wafer; the BOX of the first wafer is placed on the metallization of the second wafer. The glass handler wafer is removed, and Vias are etched through the first wafer and the metallization of the second wafer to provide electrical connection between the wafers.

Figure 6:
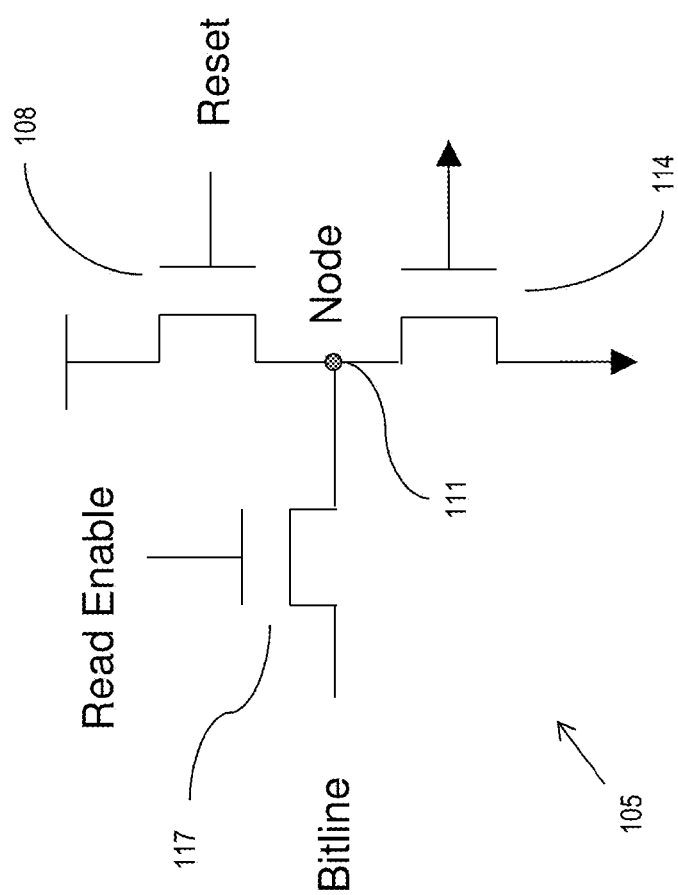
FIG. 6 is a schematic diagram of a radiation sensor illustrating embodiments herein.

The sensor array is fabricated in the first wafer, and the integrated circuit is processed in the second wafer. Preferentially, the first wafer has a very thick SOI layer to increase the charge collection volume. Preferentially, the source and drain implants do not extend to the BOX, so that holes generated in the source/drain diffusions are collected in the body, charging the body and causing a parasitic bipolar response. The SOI radiation detector 105 comprises three transistors, as shown in FIG. 6. The Reset signal 108 is used to charge the internal node 111. A radiation event on the pulldown device 114 discharges the node. When the Read Enable signal 117 is exercised, the access device writes the node state to the bitline (high indicates no event; low indicates a radiation event). To increase the sensitive area in each cell, multiple pulldown devices may be connected in parallel, since an event on any pulldown device will discharge the node 111. For SOI devices with thick SOI layer and source drain implants that do not extend to the BOX, the body, source and drain serve as collection area. SOI circuits can be designed with Qcrit~1 fC. Depending on their energy, alpha particles generate 4-13 fC/µm in silicon, so the alpha particle path length through the SOI layer would need to be 0.08-0.25 µm. Having an SOI layer thickness of 0.25 µm allows detection of alpha particles of any energy and angle that hits the sensitive region.

Figure 7:
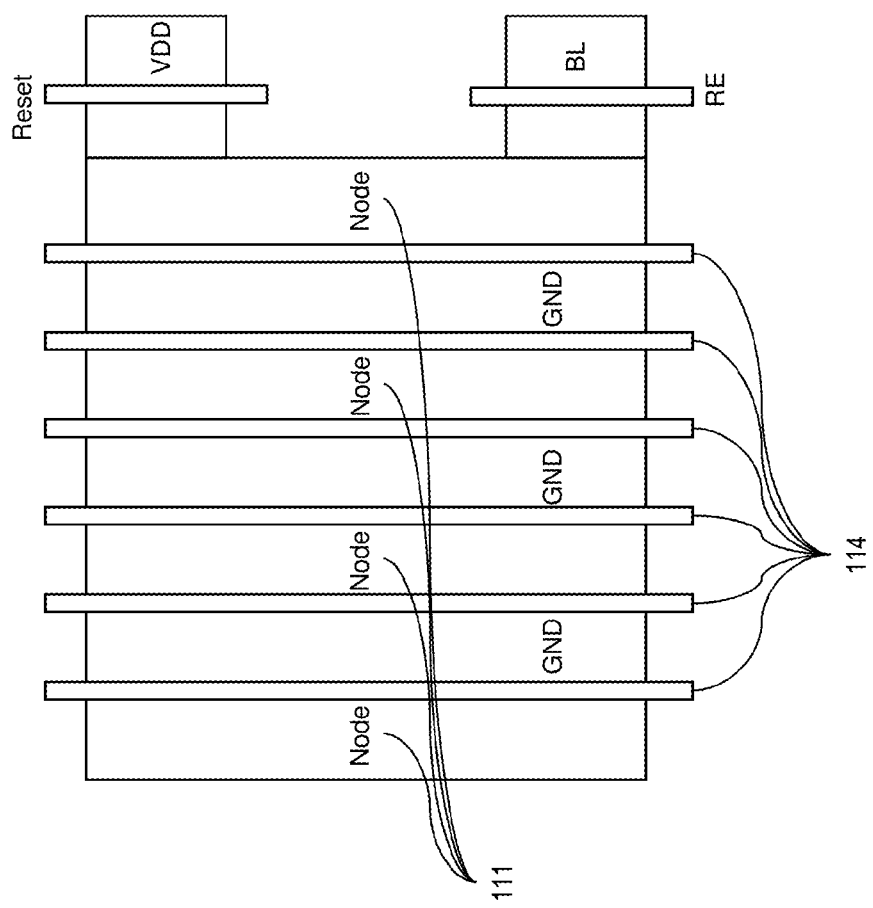
FIG. 7 is a diagram of an SOI radiation sensor cell illustrating embodiments herein.

FIG. 7 shows a layout of an SOI radiation detector cell, with six pull down devices 114 in parallel. The drains of all the pull down devices, labeled Node 111, are connected through metal wiring levels (not shown).

Figure 8:
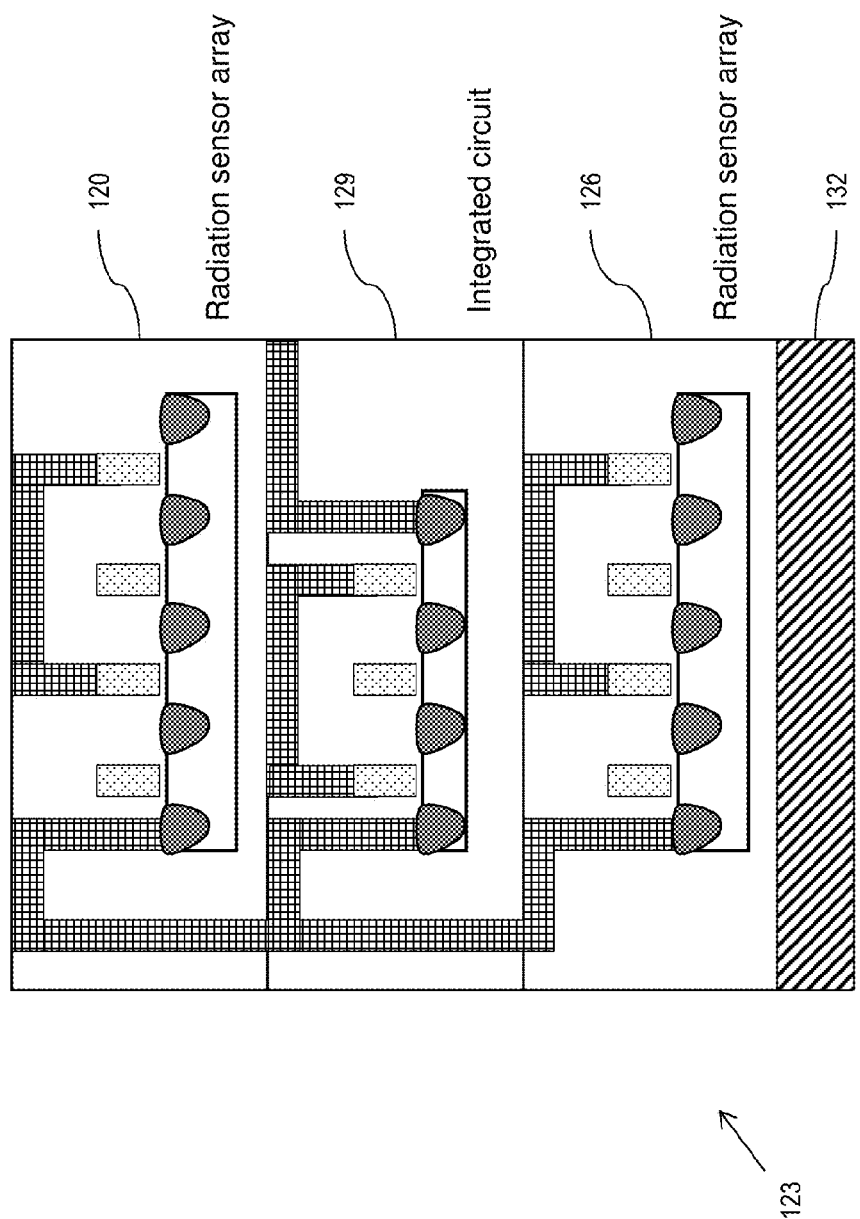
FIG. 8 is a cross section view of an SOI cell array illustrating embodiments herein.

As shown in FIG. 8, an array 120 of SOI radiation sensor cells is fabricated on an SOI wafer 123. Two or more layers 120, 126 of radiation sensor arrays are assembled with the integrated circuit 129 by 3D chip stacking on a substrate 132.

Figure 9:
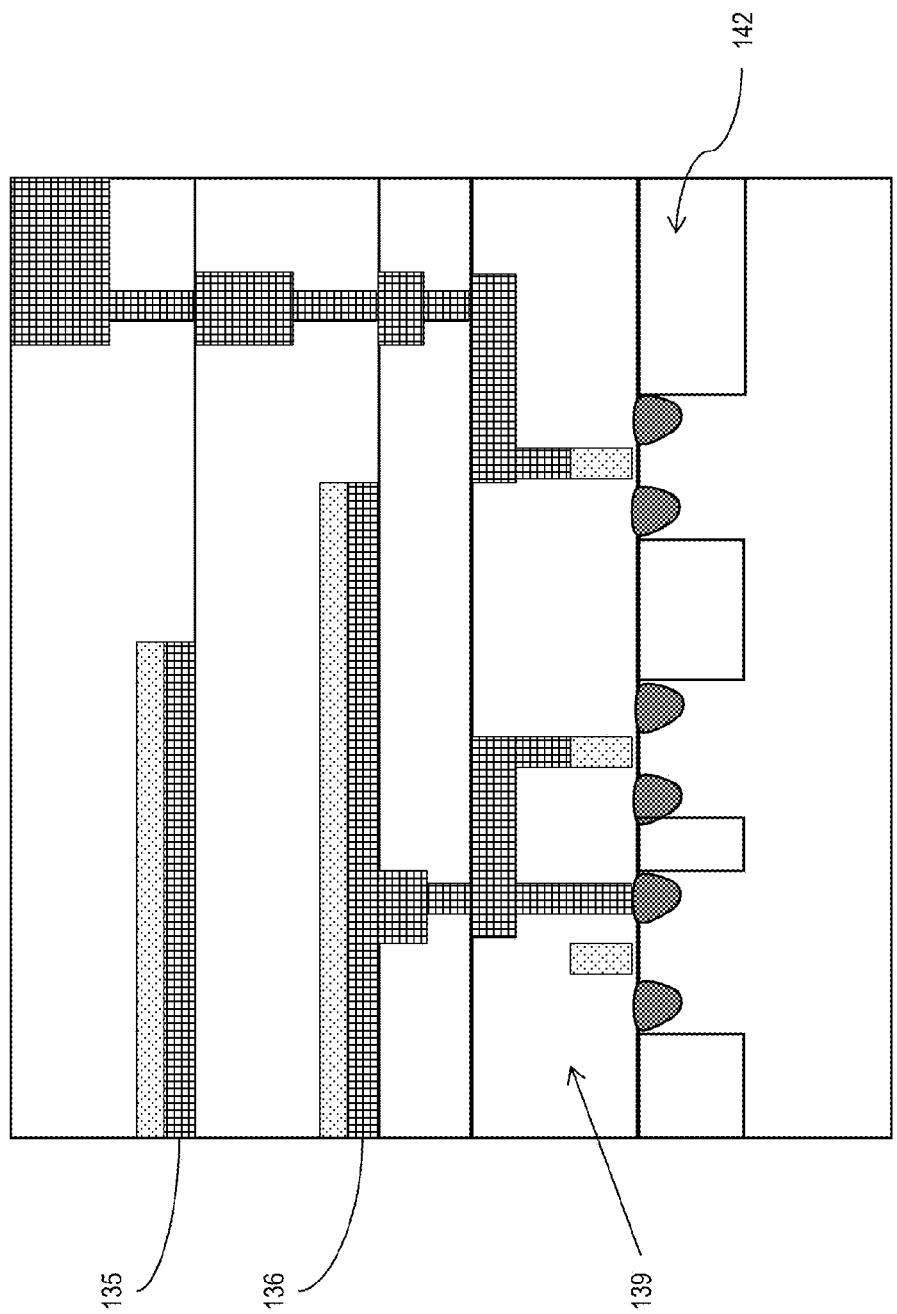
FIG. 9 is a cross section view of a Schottky diode array illustrating embodiments herein.

In an alternate embodiment, as shown in FIG. 9, two or more arrays of Schottky diodes 135, 136 are processed in BEOL metallization. The sensor cell 139 comprises reverse-biased Schottky diodes connected to a sense circuit, such as a domino, assembled with the integrated circuit 142.

The various embodiments provide a set of structures that detect energetic particle radiation as it passes through the sensor planes. The coordinates within each sensor plane where the radiation penetrates are used to extrapolate the location on the plane of the integrated circuit. This coordinate can then be used by a processor to reevaluate the values or state of the affected circuit.

In an exemplary embodiment, parallel detector arrays are provided on a silicon interposer. Detection of a radiation event in one sensor of an array flags the event, but does not tell what part of the chip was affected. Detection of the same event in two parallel but separated arrays allows the trajectory to be determined. With a radiation event locator, a specific circuit operation can be flagged for error checking to correct any loss of information that might have occurred due to the radiation event.

According to one embodiment herein, a system to ensure correct operation of a semiconductor chip in the presence of ionizing radiation is disclosed. The system includes a semiconductor chip, a first radiation detection array incorporated in the semiconductor chip, and at least one additional radiation detection array incorporated in the semiconductor chip. A processor determines a region of the semiconductor chip affected by an incident radiation particle by analyzing the trajectory of the radiation particle determined from locations of sensors hit by the radiation particle in the first radiation detection array and the at least one additional radiation detection array. The processor determines whether corrective action is needed based on the region of the semiconductor chip affected by the incident radiation particle.

An integrated circuit is protected against SEUs by integrating on-chip arrays of radiation sensors. The radiation sensor arrays measure the position of an ionizing radiation particle as it passes through the chip. A processor, which may be an integrated circuit on the chip, calculates the trajectory of the radiation particle, and the location of the radiation event in the chip's sensitive volume. The processor determines whether corrective action, such as rollback to a checkpoint or command re-execution, is necessary based on the location of the radiation event and the previous workload. For example, radiation events in memory arrays may be protected by error detection and correction (EDAC); while radiation events in a functional unit performing a calculation require corrective action.

Two sensor planes are each composed of an addressable matrix of detectors that will switch at a predetermined threshold of generation-recombination due to the penetration of a high-energy particle. One implementation of this structure would consist of a matrix of image sensors within each sensor plane coupled into a two multiplexers to provide sets of coordinates as show in FIG. 10.

Figure 10:
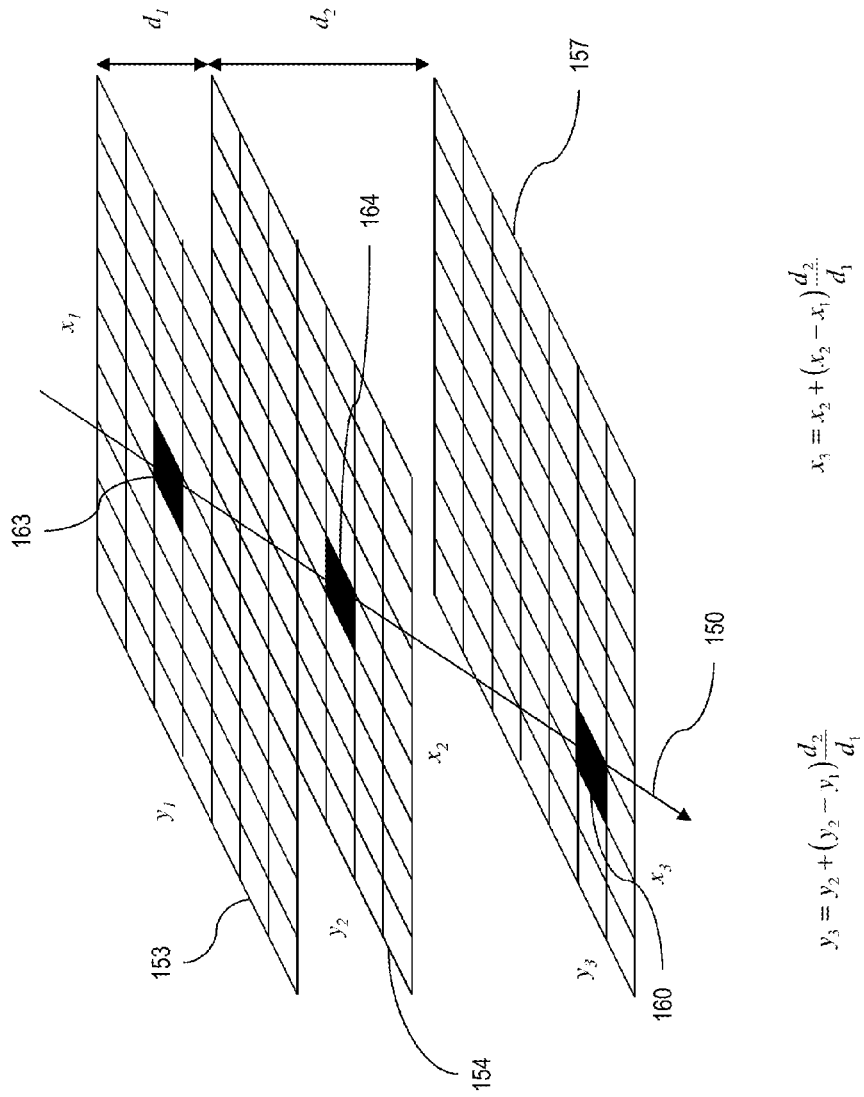
FIG. 10 is a trajectory diagram according to embodiments herein.

FIG. 10 illustrates the trajectory 150 of an ionizing radiation particle through two sensor arrays 153, 154 and through the sensitive volume 157. The two sensor arrays 153, 154 are separated from each other by a distance $d_1$ and from the sensitive volume 157 by a distance $d_2$. The two sensor arrays 153, 154 may both be situated on the same side of the sensitive volume 157 or may be on opposite sides of the sensitive volume 157. The radiation event location 160 in the device layer is calculated from the location of the sensor 163, 164 detecting the radiation event in each sensor layer.

$$x_3 = x_2 + (x_2 - x_1)\frac{d_2}{d_1}$$

$$y_3 = y_2 + (y_2 - y_1)\frac{d_2}{d_1}$$

Figure 11:
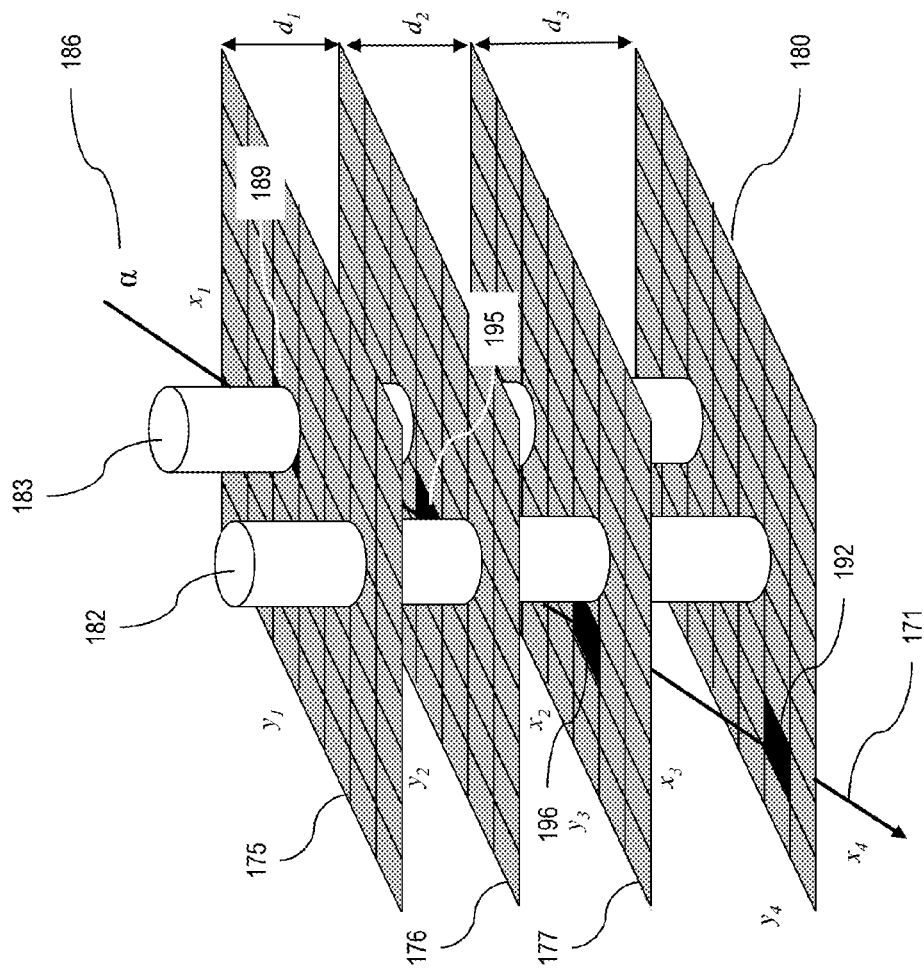
FIG. 11 is a trajectory diagram according to embodiments herein.

FIG. 11 illustrates the trajectory 171 of an ionizing radiation particle a 186 through three sensor arrays 175, 176, 177 and through the sensitive volume 180. In this illustration, the chip includes two Vias 182, 183. The sensor arrays 175, 176, 177 are separated from each other by distances $d_1$, $d_2$ and from the sensitive volume 180 by a distance $d_3$. The sensor arrays 175, 176, 177 may be situated on the same side of the sensitive volume 180 or one may be on the opposite side of the sensitive volume 180 from the remaining two. In this illustration, the ionizing radiation particle a 186 hits a blind spot 189 in the top sensor array 175, but its strike location 192 in the sensitive volume 180 is calculated from its intersection with the sensors 195, 196 in the middle and bottom sensor arrays 176, 177, respectively:

$$\text{if: } x_1 \cdot y_1 \cdot x_2 \cdot y_2 \neq 0 \ldots$$

$$x_4 = x_2 + (x_2 - x_1)\frac{d_2}{d_1}$$

$$y_4 = y_2 + (y_2 - y_1)\frac{d_2}{d_1}$$

$$\text{else\_if: } x_2 \cdot y_2 \cdot x_3 \cdot y_3 \neq 0 \ldots$$

$$x_4 = x_3 + (x_3 - x_2)\frac{d_3}{d_2}$$

$$y_4 = y_3 + (y_3 - y_2)\frac{d_3}{d_2}$$

At least two sensor planes composed of an addressable matrix of detectors are required to extrapolate the location of the incident radiation particle on a third plane. Three or more sensor planes may be used. The coordinates of each sensor in each plane where the radiation particle penetrates are used to extrapolate the location on the plane of the active chip (microprocessor, ASIC, FPGA, etc.). Two linear equations, as shown in FIG. 11, quantify the extrapolated (x,y) radiation particle event coordinates.

In actual fabrication, Via structures must pass through the Silicon (Sensor) Interposer to connect MCM to the BEOL Chip Pads. Due to these Vias, multiple sensor layers may be required to calculate trajectory, since detectors will no longer have 100% area coverage. Since there may be (n) number of sensor planes there may be (n−1) linear equations used to extrapolate the (x,y) SEU coordinates, as shown in FIG. 10. Only a few sets have been shown with the conditional expression; for example, if the radiation particle passes through a Via the sensor array will return only "0's", if the radiation particle passes through a sensor it will return an explicit "1" for that sensor's (x,y) location.

In a terrestrial radiation environment, either the Schottky diode sensor arrays or the 3D packaging chip-stacking sensor arrays can be used to detect the passage of alpha particles or daughter particles from cosmic ray neutron collisions. Because of the close proximity of the sensor array to the active silicon, the ionizing radiation particle will strike the functional unit below the sensor.

In a space radiation environment, sensor arrays on a silicon carrier can be used to detect the passage of energetic heavy ions. Sensor arrays on a silicon carrier cannot be used to detect alpha particles in a terrestrial environment because many alpha particles detected in the silicon carrier will not reach the active silicon, due to the limited range of alpha particles (tens of microns). When multiple layers of sensor arrays are present, the location of the ionizing radiation particle in each layer is passed to the integrated circuit, which calculates the strike location in the sensitive volume. Through Vias in the silicon carrier limit the surface coverage of the sensor arrays, so it is preferable to have three or more layers of sensor arrays in case the ionizing radiation trajectory crosses a blind spot in a sensor array.

In all cases, the processor determines which functional unit was affected by the ionizing radiation and determines whether corrective action is necessary. For example, radiation events in memory arrays or registers can be ignored if these units are protected by EDAC. Moreover, radiation events in inactive functional units may also be ignored.

Figure 12:
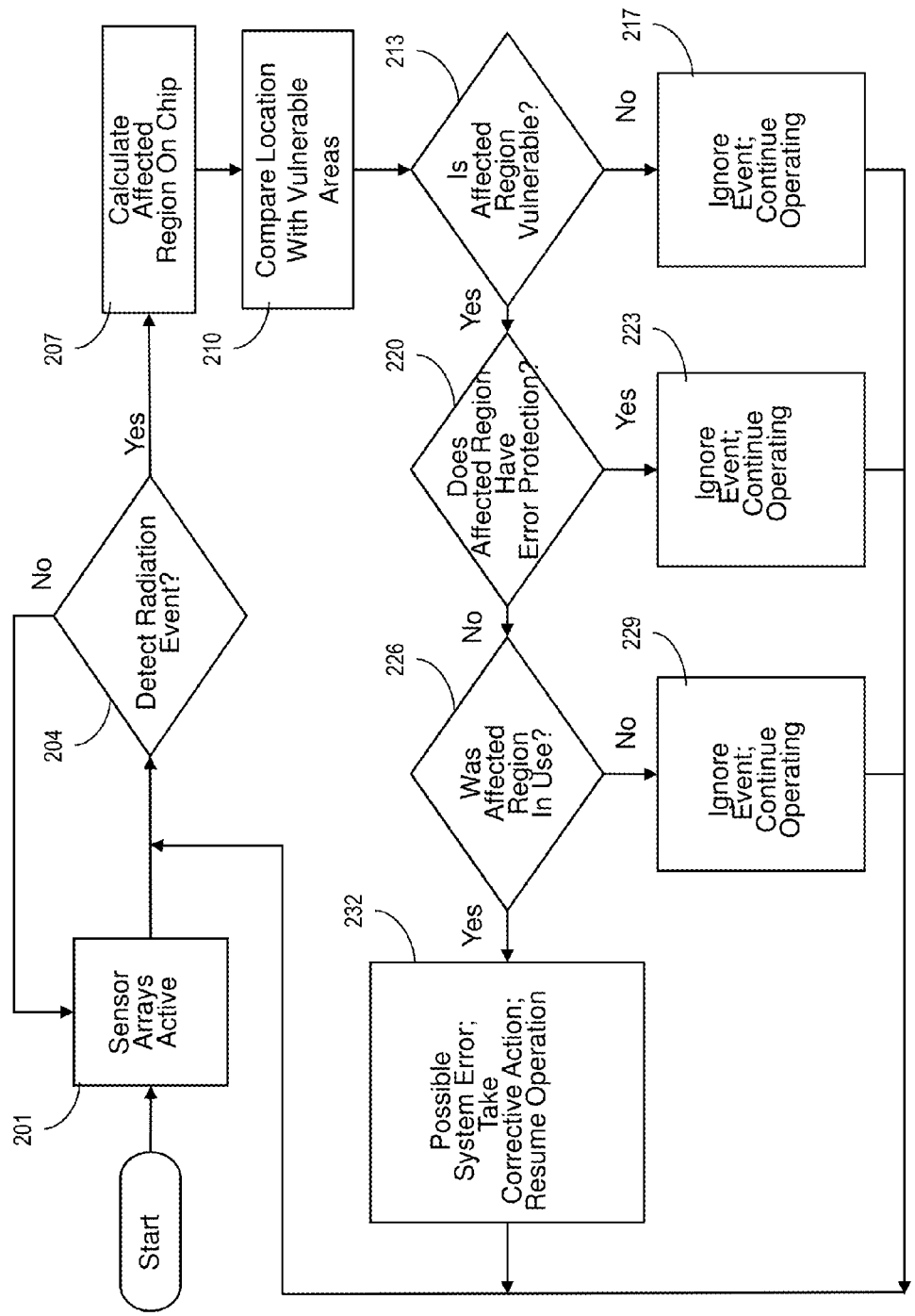
FIG. 12 is a flow diagram illustrating embodiments herein.

The flow chart of FIG. 12 highlights the decision process whether to take corrective action after a radiation event. According to another embodiment herein, a computer-implemented method of ensuring correct operation of a semiconductor chip in the presence of ionizing radiation is disclosed. Interaction of a radiation particle with a first radiation detection array incorporated in a semiconductor chip is detected. The first radiation detection array provides a location of the sensors hit by the radiation particle to a computing device. Interaction of the radiation particle with at least one additional radiation detection array incorporated in the semiconductor chip is detected. The at least one additional radiation detection array provides a location of the sensors hit by the radiation particle to the computing device. The computing device calculates a trajectory of the radiation particle and determines a region of the semiconductor chip affected by the radiation particle. The computing device analyzes operation of the affected region of the semiconductor chip. The computing device determines whether corrective action is needed based on the region of the semiconductor chip affected by the radiation particle.

While a Cartesian grid coordinate system has been used in describing the method of determining the location of a radiation particle event in a chip, other grid coordinate systems, such as polar coordinates, among others, can be used.

In summary, an embodiment herein relates to a structure and method comprising:

integrating addressable planar sensor arrays into packaging, active chip, or added interposer to detect an incident radiation particle upon an integrated circuit chip;

determining a region of the chip affected by the incident radiation particle based on a trajectory of the incident radiation particle determined from locations of sensors hit by the radiation particle in two or more sensor arrays; and, based on the determined region of the chip affected by the incident radiation particle, determining whether a corrective action is needed (i.e., rather than taking corrective action each time a radiation event is detected, determine whether corrective action is actually needed on a case by case basis; can improve performance by reducing time required for corrective action, can reduce cost of chip and reduce power consumption).

A second method of employment is to measure the radiation flux on an IC. We do not accurately know the radiation flux of a packaged IC. The alpha flux of many low-alpha materials is at the detection limit of current alpha detectors, so it is too costly to measure the alpha flux of each lot of materials. Periodic sampling may not catch high flying lots. In addition, alpha-emitting impurities may be introduced during wafer processing. Such wafer contamination may be extremely difficult to identify since it may be restricted to individual tools. An alpha flux on the order of 1 $ct/cm^2$-khr can have a significant impact on the SEU rate of an integrated circuit.

Both Schottky diode sensor arrays and 3D packaging chip-stacking sensor arrays can be used to measure the radiation flux in an IC. For instance, a 300 mm wafer is devoted to radiation monitoring; assuming 50% surface coverage, an alpha flux of 1 $ct/cm^2$-khr would lead to 0.35 ct/hr, or eight events per week. Regular monitoring could be used to determine the radiation flux to use in SEU calculations, and high flyers would identify alpha contamination. An advantage of on-chip alpha detection is the elimination of the background counts in a standard alpha detector.

In space applications, any sensor array could be used to monitor the radiation flux. If the radiation flux exceeds preset limits, the integrated circuit takes drastic actions, such as switching to safe mode and lowering the supply voltage to avoid permanent damage from single-event latchup. This method is designed to protect the integrated circuit from non-random radiation sources such as a Coronal Mass Ejection (CME) or passing through a radiation belt.

As will be appreciated by one skilled in the art, aspects of the systems and methods herein may be embodied as a system, method, or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable non-transitory medium(s) may be utilized. The computer readable medium may be a computer readable signal medium or a computer readable storage medium. The non-transitory computer storage medium stores instructions, and a processor executes the instructions to perform the methods described herein. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described with reference to flowchart illustrations and/or block diagrams of methods, apparatus (systems) and computer program products according to embodiments herein. It will be understood that each block of the flowchart illustrations and/or two-dimensional block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 13:
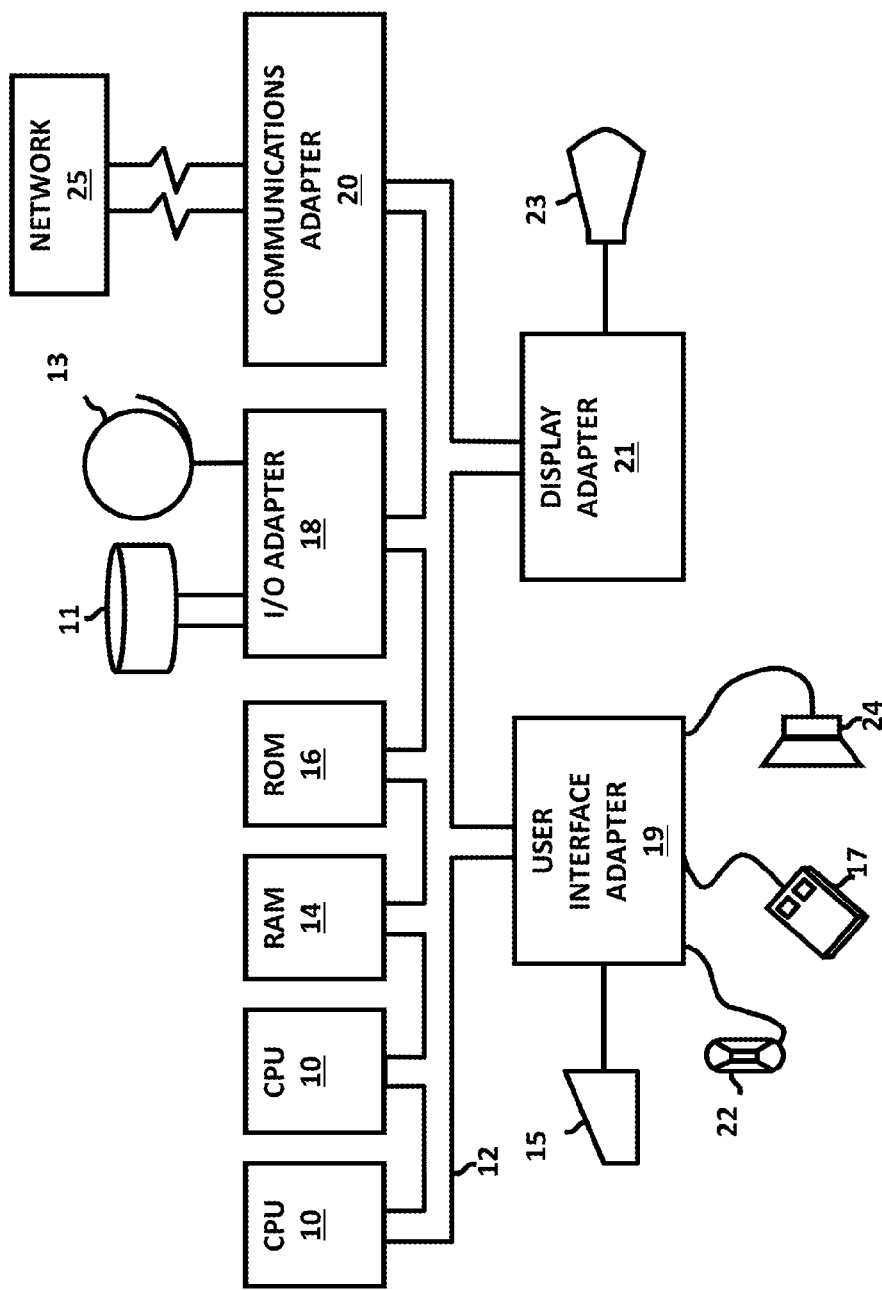
FIG. 13 is a schematic diagram of a hardware system according to embodiments herein.

A representative hardware environment for practicing the embodiments herein is depicted in FIG. 13. This schematic drawing illustrates a hardware configuration of an information handling/computer system in accordance with the embodiments herein. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments herein. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23, which may be embodied as an output device such as a monitor, printer, or transmitter, for example.

The flowchart and block diagrams in the Figures illustrate the architecture, functionality, and operation of possible implementations of systems, methods, and computer program products according to various embodiments herein. In this regard, each block in the flowchart or block diagrams may represent a module, segment, or portion of code, which comprises one or more executable instructions for implementing the specified logical function(s). It should also be noted that, in some alternative implementations, the functions noted in the block might occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

For purposes herein, a "semiconductor" is a material or structure that may include an implanted impurity that allows the material to sometimes be a conductor and sometimes be an insulator, based on electron and hole carrier concentration. As used herein, "implantation processes" can take any appropriate form (whether now known or developed in the future) and can comprise, for example, ion implantation, etc.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to silicon nitride, silicon oxynitride, a gate dielectric stack of $SiO_2$ and $Si_3N_4$, and metal oxides like tantalum oxide. The thickness of dielectrics herein may vary contingent upon the required device performance.

The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

Within a transistor, the semiconductor (or channel region) is positioned between a conductive "source" region and a similarly conductive "drain" region and when the semiconductor is in a conductive state, the semiconductor allows electrical current to flow between the source and drain. A "gate" is a conductive element that is electrically separated from the semiconductor by a "gate oxide" (which is an insulator) and current/voltage within the gate changes the conductivity of the channel region of the transistor.

A positive-type transistor "P-type transistor" uses impurities such as boron, aluminum or gallium, etc., within an intrinsic semiconductor substrate (to create deficiencies of valence electrons) as a semiconductor region. Similarly, an "N-type transistor" is a negative-type transistor that uses impurities such as antimony, arsenic or phosphorous, etc., within an intrinsic semiconductor substrate (to create excessive valence electrons) as a semiconductor region.

Generally, transistor structures are formed by depositing or implanting impurities into a substrate to form at least one semiconductor channel region, bordered by shallow trench isolation regions below the top (upper) surface of the substrate. A "substrate" herein can comprise any material appropriate for the given purpose (whether now known or developed in the future) and can comprise, for example, Si, SiC, SiGe, SiGeC, other III-V or II-VI compound semiconductors, or organic semiconductor structures, etc. The "shallow trench isolation" (STI) structures are well known to those ordinarily skilled in the art and are generally formed by patterning openings/trenches within the substrate and growing or filling the openings with a highly insulating material (this allows different active areas of the substrate to be electrically isolated from one another).

While only one or a limited number of transistors are illustrated in the drawings, those ordinarily skilled in the art would understand that many different types transistor could be simultaneously formed with the embodiment herein and the drawings are intended to show simultaneous formation of multiple different types of transistors; however, the drawings have been simplified to only show a limited number of transistors for clarity and to allow the reader to more easily recognize the different features illustrated. This is not intended to limit this disclosure because, as would be understood by those ordinarily skilled in the art, this disclosure is applicable to structures that include many of each type of transistor shown in the drawings.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of this disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system comprising:
   a chip;
   a first radiation detection array incorporated in said chip;
   at least one additional radiation detection array incorporated in said chip; and
   a processor calculating a trajectory of a radiation particle determined from locations of sensors hit by said radiation particle in said first radiation detection array and in said at least one additional radiation detection array, and determining an affected region of said chip affected by said radiation particle by analyzing said trajectory of said radiation particle, and
   said processor executing a corrective action, including one of a roll-back to a checkpoint and a command reissue, based on a location of a radiation event and a previous workload, in said affected region of said chip affected by said radiation particle.

2. The system of claim 1, said first radiation detection array and said at least one additional radiation detection array comprising a plurality of addressable sensor cells.

3. The system of claim 1, said chip comprising a semiconductor chip.

4. The system of claim 3, said semiconductor chip comprising a plurality of layers, at least one layer comprising an integrated circuit.

5. The system of claim 4, said first radiation detection array being disposed on the same side of said at least one layer comprising an integrated circuit as said at least one additional radiation detection array.

6. The system of claim 4, said first radiation detection array being disposed on an opposite side of said at least one layer comprising an integrated circuit as said at least one additional radiation detection array.

7. The system of claim 4, said semiconductor chip comprising at least one interposer layer.

8. The system of claim 4, said semiconductor chip comprising a plurality of areas selected from the group consisting of:
   an active region;
   a passive region;
   volatile memory; and
   non-volatile memory.

9. A computer implemented method comprising:
   detecting an interaction of a radiation particle with a first radiation detection array incorporated in a chip, using a computing device;
   detecting an interaction of said radiation particle with at least one additional radiation detection array incorporated in said chip, using said computing device;
   calculating, by said computing device, a trajectory of said radiation particle;
   determining, by said computing device, an affected region of said chip affected by said radiation particle based on said trajectory of said radiation particle;
   determining, by said computing device, operation of said affected region of said chip affected by said radiation particle; and
   executing, by said computing device, a corrective action, including one of a roll-back to a checkpoint and a command reissue, based on a location of a radiation event and a previous workload, in said affected region of said chip affected by said radiation particle.

10. The method of claim 9, said first radiation detection array comprising a first plurality of addressable sensor cells, said first radiation detection array providing a first location of sensors hit by said radiation particle to said computing device, and
    said at least one additional radiation detection array comprising a second plurality of addressable sensor cells, said at least one additional radiation detection array providing a second location of sensors hit by said radiation particle to said computing device.

11. The method of claim 9, said determining said affected region of said chip affected by said radiation particle comprising using linear equations to extrapolate coordinates of an area of said chip, based on said trajectory of said radiation particle.

12. The method of claim 11, further comprising using coordinates within said first radiation detection array where said radiation particle penetrates and coordinates within said at least one additional radiation detection array where said radiation particle penetrates to extrapolate a location on a plane of said chip where said radiation particle penetrated.

13. The method of claim 9, said chip comprising a semiconductor chip.

14. The method of claim 9, said executing of said corrective action being based on at least one of:
    determining said affected region of said chip affected by said radiation particle is vulnerable;
    determining said affected region of said chip affected by said radiation particle has error protection; and
    determining said affected region of said chip affected by said radiation particle is operating.

15. A non-transitory computer readable storage medium readable by a computerized device, said non-transitory computer readable storage medium storing instructions executable by said computerized device to perform a method comprising:
    detecting an interaction of a radiation particle with a first radiation detection array incorporated in a chip;
    detecting an interaction of said radiation particle with at least one additional radiation detection array incorporated in said chip;
    calculating a trajectory of said radiation particle;
    determining an affected region of said chip affected by said radiation particle based on said trajectory of said radiation particle;
    analyzing operation of said affected region of said chip affected by said radiation particle; and
    executing a corrective action, including one of a roll-back to a checkpoint and a command reissue, based on a location of a radiation event and a previous workload, in said affected region of said chip affected by said radiation particle.

16. The non-transitory computer readable storage medium of claim 15, said first radiation detection array comprising a first plurality of addressable sensor cells and said at least one additional radiation detection array comprising a second plurality of addressable sensor cells, said method further comprising:

said first radiation detection array providing a first location of sensors hit by said radiation particle, and said at least one additional radiation detection array providing a second location of sensors hit by said radiation particle.

17. The non-transitory computer readable storage medium of claim 15, said method further comprising:

determining said affected region of said chip affected by said radiation particle using linear equations to extrapolate coordinates of an area of said chip, based on said trajectory of said radiation particle.

18. The non-transitory computer readable storage medium of claim 17, said method further comprising:

using coordinates within said first radiation detection array where said radiation particle penetrates and coordinates within said at least one additional radiation detection array where said radiation particle penetrates to extrapolate a location on a plane of said chip where said radiation particle penetrated.

19. The non-transitory computer readable storage medium of claim 15, said chip comprising a semiconductor chip.

20. The non-transitory computer readable storage medium of claim 15, said method further comprising:

analyzing whether corrective action is needed comprising at least one of:

determining said affected region of said chip affected by said radiation particle is vulnerable;

determining said affected region of said chip affected by said radiation particle has error protection; and determining said affected region of said chip affected by said radiation particle is operating.

* * * * *